United States Patent [19]
Dietz

[11] Patent Number: 5,834,929
[45] Date of Patent: Nov. 10, 1998

[54] TEST PROBE GUIDE DEVICE

[76] Inventor: John Gregory Dietz, 233 Virginia St., Sellersburg, Ind. 47172

[21] Appl. No.: 911,577

[22] Filed: Aug. 14, 1997

[51] Int. Cl.[6] .............................. G01R 1/04; G01R 31/02
[52] U.S. Cl. ........................ 324/72.5; 324/149; 324/754; 324/757; 439/482
[58] Field of Search .................... 324/72.5, 133, 324/149, 555, 556, 754, 757, 758, 761; 439/169, 219, 416, 482; 206/305, 702

[56] References Cited

U.S. PATENT DOCUMENTS

| | | | |
|---|---|---|---|
| 467,891 | 1/1892 | Neu | 324/72.5 |
| 3,373,863 | 3/1968 | Afton | 206/16.5 |
| 3,495,697 | 2/1970 | Catelli | 206/16.5 |
| 3,864,629 | 2/1975 | Danna | 324/72.5 |
| 3,918,579 | 11/1975 | Diamant | 206/306 |
| 4,716,365 | 12/1987 | Pool | 324/72.5 |
| 5,001,421 | 3/1991 | Kawada et al. | 324/72.5 |
| 5,414,346 | 5/1995 | Mohan | 324/72.5 |
| 5,457,392 | 10/1995 | Filipescu | 324/149 |
| 5,717,328 | 2/1998 | Kerr et al. | 324/149 |

*Primary Examiner*—Diep N. Do
*Attorney, Agent, or Firm*—Henderson & Sturm

[57] ABSTRACT

A test probe guide device 10 for use with a conventional electrical test probe 100 and an electrical wire 200 wherein the guide device 10 includes a housing member 20 dimensioned to receive the test probe 100 and spring biased plunger disk 30 and further including a wire engaging unit 13 comprising a hook member 40 dimensioned to captively engage the electrical wire 200 to allow the test probe needle 102 to be electrically connected to the electrical wire 200.

1 Claim, 1 Drawing Sheet

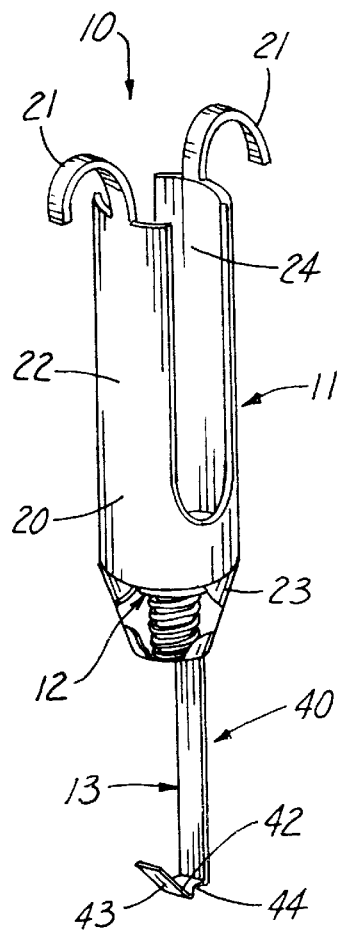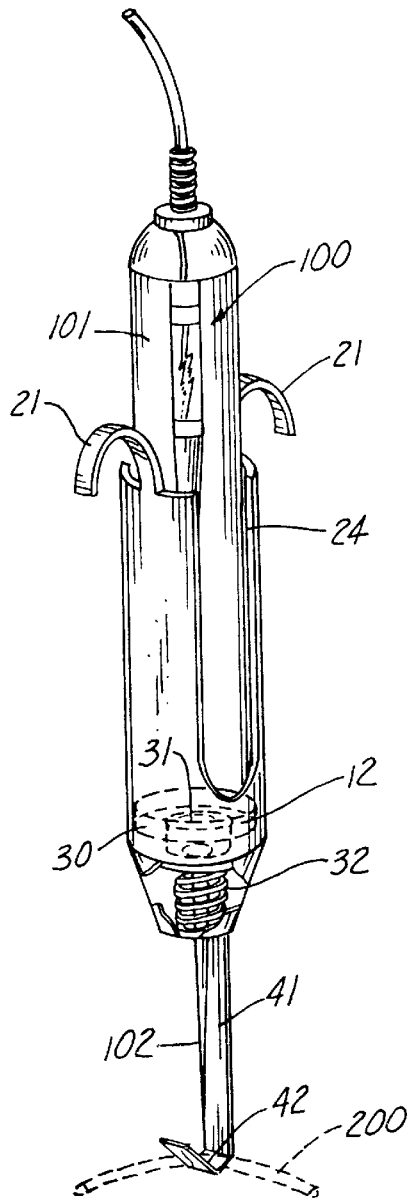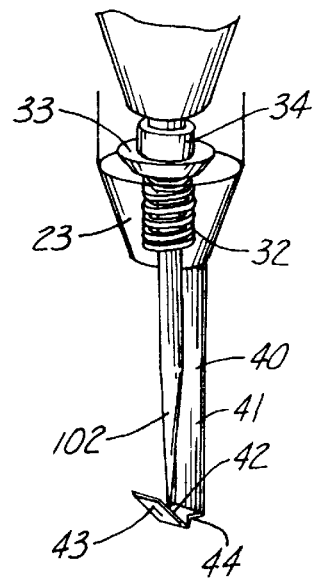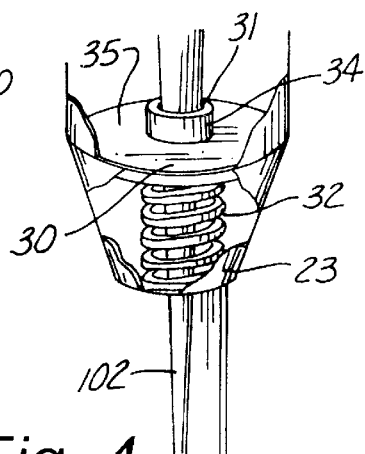
Fig. 1
Fig. 2
Fig. 3
Fig. 4

TEST PROBE GUIDE DEVICE

CROSS REFERENCE TO RELATED APPLICATIONS

Not applicable

STATEMENT REGARDING FEDERALLY SPONSORED RESEARCH OR DEVELOPMENT

Not applicable

REFERENCE TO MICROFICHE APPENDIX

Not applicable

BACKGROUND OF THE INVENTION

1. Field of the Invention

The present invention relates to the field of electrical test probes in general, and in particular to a guide device to facilitate the use of a conventional test probe.

2. Description of Related Art

As can be seen by reference to the following U.S. Pat. Nos. 3,373,863; 3,495,697; 3,918,579; and 4,061,226, the prior art is replete with myriad and diverse special article holders used to facilitate the use of specific items.

While all of the aforementioned prior art constructions are more than adequate for the basic purpose and function for which they have been specifically designed, they are uniformly deficient with respect to their failure to provide a simple, efficient, safe, and convenient device for positioning an electrical test probe into and out of engagement with an electrical wire or the like.

As most electricians are well aware, the use of a conventional electrical test probe is often a cumbersome and sometimes painful procedure that usually requires two hands and can almost never be routinely practiced in a safe, simple, and convenient manner.

As a consequence of the foregoing situation, there has existed a longstanding need for a new and improved guide device for an electrical test probe that will allow the one handed engagement of the test probe with an electrical wire even in relatively inaccessible areas, and the provision of such a construction is a stated objective of the present invention.

BRIEF SUMMARY OF THE INVENTION

Briefly stated, the test probe guide device that forms the basis of the present invention comprises in general, a housing unit containing an internal plunger unit and operatively connected to a wire engaging extension unit. The housing unit is dimensioned to receive a conventional electrical test probe and the extension unit is dimensioned to receive an electrical wire.

As will be explained in greater detail further on in the specification, the housing unit comprises a housing member provided with finger engaging arms for exerting a downward force on the test probe against the spring biased plunger unit to bring the test probe needle into electrical contact with the electrical wire engaged by the wire engaging extension unit.

This arrangement allows an electrician to employ only a single hand to engage and test a selected electrical wire by use of this device wherein the wire engaging unit gives the electrician access into obstructed areas that could not be accessed without the benefit of a guide device constructed in accordance with the teachings and structure employed in conjunction with this invention.

BRIEF DESCRIPTION OF THE SEVERAL VIEWS OF THE DRAWINGS

These and other attributes of the invention will become more clear upon a thorough study of the following description of the best mode for carrying out the invention, particularly when reviewed in conjunction with the drawings, wherein:

FIG. 1 is an isolated perspective view of the test probe guide device that forms the basis of the present invention;

FIG. 2 is a perspective view of the guide device operatively engaging a conventional electrical test probe;

FIG. 3 is an isolated detail view of the engagement between the probe needle and one version of the internal guide collar; and FIG. 4 is an isolated detail view of the engagement of the probe needle with another version of the guide collar.

DETAILED DESCRIPTION OF THE INVENTION

As can be seen by reference to the drawings, and in particularly to FIG. 1, the test probe guide device that forms the basis of the present invention is designated generally by the reference number 10. The guide device 10 comprises in general, a main housing unit 11 having an internal plunger unit 12 and a wire engaging extension unit 13. These units will now be described in seriatim fashion.

Prior to embarking on a detailed description of the guide device 10, it would first be advisable to briefly describe the environment in which this invention is intended for use. As shown in FIGS. 2 through 4, the invention is designed to bring a conventional electrical test probe 100 including a test probe body 101 having a probe needle 102, into engagement with an electrical wire 200 so that the test probe 100 can measure the electrical current flowing through the wire 200.

As can best be seen by reference to FIG. 1, the main housing unit 11 comprises an elongated, electrically insulated, generally cylindrical, hollow housing member 20 having a pair of curved finger engaging arms 21 formed in the upper portion 22 of the housing member 20 and a tapered lower portion 23 whose purpose and function will be described presently.

In addition, the upper portion 22 of the housing member 20 is dimensioned to slideably receive the test probe body 101 and is further provided with a pair of enlarged elongated slots 24 which will allow the user to visually observe any readout data that may appear on the sides of certain types of conventional test probes 100.

As can best be seen by reference to FIGS. 2 through 4, the lower portion 23 of the housing member 20 is dimensioned to receive the internal plunger unit 12 which comprises an electrical insulated plunger disk 30 provided with a central aperture 31 dimensioned to receive at least a portion of the probe needle 102. The plunger disk 30 is biased upwardly relative to the bottom of the lower portion 23 of the housing member by a spring element 32 whose purpose and function will be described presently.

In one version of the preferred embodiment illustrated in FIG. 3, the plunger disk 30 includes a reduced diameter disk element 33 which permits a certain amount of lateral movement of the probe needle 102 within the upper 22 and lower 23 portions of the housing member 20. However, in the other version of the preferred embodiment, the plunger disk 30 comprises an enlarged diameter disk element 35 which closely conforms to the interior of the housing member 20.

In addition, in both versions of the preferred embodiment, the disk elements 33 and 35 are provided with a collar element 34 which is dimensioned to frictionally engage a portion of the probe needle 102 in a well recognized fashion.

Turning now to FIGS. 1 through 3, it can be seen that the wire engaging extension unit 13 comprises an elongated electrically insulated J-shaped hook member 40 including a stem 41 which extends downwardly from the lower portion 23 of the housing member 20, a base 42 which projects outwardly from the stem 41 and a lip 43 which projects upwardly from the outboard end of the base 42.

As can be appreciated by reference to FIGS. 2 and 3, the hook member 40 is designed to engage an electrical wire 200 such that the probe needle 102 can make electrical contact with the wire 200 in the convention manner. In addition, the base 42 of the hook member 40 may further be provided with a notch 44 to further enhance the captive engagement of the wire 200 relative to the hook member 40.

In use, an electrician would insert the test probe 100 into the guide device 10 such that the probe needle 102 would project through the lower portion 23 of the housing member 20. The electrician would engage the electrical wire 200 to be tested with the hook member 40, then grasp the finger engaging arms 21 of the housing member 20 and impart a downward force on the test probe body 101 to overcome the spring biasing of spring element 32 and electrically connect the probe needle 102 with the wire 200 in a well recognized fashion.

Although only an exemplary embodiment of the invention has been described in detail above, those skilled in the art will readily appreciate that many modifications are possible without materially departing from the novel teachings and advantages of this invention. Accordingly, all such modifications are intended to be included within the scope of this invention as defined in the following claims.

In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooded parts together, whereas, a screw employs a helical surface, in the environment of fastening wooden parts, a nail and a screw may be equivalent structures.

I claim:

1. A test probe guide device for use in combination with a conventional electrical test probe including a probe body and a probe needle for engagement with an electrical wire wherein the test probe guide device consists of:

a housing unit including an elongated hollow housing member dimensioned to slidably receive said test probe; and comprising: a generally cylindrical upper portion provided with a pair of finger engaging arms and at least one elongated slot; and, a contoured lowered portion;

a plunger unit dimensioned to be received in said contoured lower portion and including a plunger disk member having an aperture dimensioned to receive a portion of the probe needle and a spring element disposed intermediate the disk member and the bottom of the housing member; and a wire engaging extension unit including a hook member operatively associated with the housing member and dimensioned to receive said electrical wire; wherein the hook member includes a stem that extends downwardly from the housing member; a base that projects outwardly from said stem; and a lip that extends upwardly from said base wherein at least one side of the base is provided with a notch dimensioned to frictionally engage said electrical wire.

\* \* \* \* \*